United States Patent [19]
Itoh et al.

[11] 4,439,841
[45] Mar. 27, 1984

[54] SEMICONDUCTOR MEMORY DEVICES
[75] Inventors: Hideo Itoh; Takahiko Yamauchi, both of Kawasaki, Japan
[73] Assignee: Fujitsu Limited, Kawasaki, Japan
[21] Appl. No.: 272,367
[22] Filed: Jun. 10, 1981
[30] Foreign Application Priority Data
Jun. 10, 1980 [JP] Japan .................................. 55/78188
[51] Int. Cl.³ ............................................ G11C 13/00
[52] U.S. Cl. ....................................... 365/51; 365/244
[58] Field of Search .................... 365/51, 174, 77, 244
[56] References Cited
U.S. PATENT DOCUMENTS
4,122,540 10/1978 Russell et al. ......................... 365/51

Primary Examiner—Terrell W. Fears
Attorney, Agent, or Firm—Staas & Halsey

[57] ABSTRACT

In a semicondcutor memory device there is provided a specific layout of each element effectively excluding a number of "bridge" crossings for specific lines connecting the elements particularly buffer circuits and a decoder circuit, and thereby reducing the amount of resistance in the lines connecting specific elements, and increasing the signal transmission speed in the specific lines. A control circuit is arranged either beneath or above a portion of the ground line or the electric power line and the control circuit is connected to either of these lines by further vertical lines, thereby eliminating certain bridges.

11 Claims, 4 Drawing Figures

SEMICONDUCTOR MEMORY DEVICES

BACKGROUND OF THE INVENTION

This invention relates to a semiconductor memory device, and, more particularly, to a semiconductor memory device in which the signal transmission speed is improved between the memory cells and/or decoder circuit and the control circuits, such as buffer circuits and various logic circuits, if any.

A semiconductor memory device includes: bonding pads for receiving input signals; various kinds of buffer circuits such as an address buffer circuit, a write-in buffer circuit, a read-out buffer circuit, the major function of which is to amplify the signals received by or generated in the semiconductor memory device; possibly some logic circuits for miscelleneous purposes and a decoder circuit for decoding the signals or transforming the format of the signals and memory cells.

One of the essential requirements for memory devices is the improvement of transmission speed of signals in the memory devices, a requirement predominantly determined by the time constant or the product of resistance and capacitance. Therefore, reduction in resistance is one of the important requirements for semiconductor memory devices. Higher grade of integration is another of the important requirements for semiconductor memory devices. Because of these factors, the layout of each ingredient constituting a semiconductor memory device is an important parameter for design of a semiconductor memory device.

FIG. 1 illustrates an exemplary layout of each ingredient constituting a semiconductor memory device available in the prior art. Referring to FIG. 1, the illustrated layout features a ground line (GND) 7 placed along the external edges of a semiconductor memory device 1 and surrounds various control circuits 4, such as an address buffer circuit, a write-in buffer circuit and a read-out buffer circuit, and logic circuits. These control circuits further surround an electric power supply line (Vcc) 6, which surrounds a group of signal lines 5, each of which connects various of the control circuits 4 with each other. The signal lines 5 finally surround memory cell areas 2 and decoder circuit 3, which are placed at the center of the semiconductor memory device 1.

The major advantage of this conventional layout illustrated in FIG. 1 is that no crossing of the electric power supply line (Vcc) 6 and the ground line (GND) 7 is required, both of which have a relatively large current capacity. Thus, there is no requirement for a so-called "bridge" between these two lines. A "bridge" is a structure in which one line crosses under the other line via a diffusion layer formed in the substrate, or one line crosses over the other line with an insulator layer therebetween. Diffusion and insulating layers are effective in avoiding a voltage drop inevitable in a bridge, thus further excluding a possibility of malfunctions caused by the voltage drop. However, this conventional layout illustrated in FIG. 1 inevitably includes a considerable number of the so-called bridges between the memory cell areas 2 and decoder circuit 3, both of which are placed at the center of the memory device 1, and the control circuits 4, such as buffer circuits and logic circuits, which are located around the cell areas and circuits 2 and 3, and between the control circuits 4 and the bonding pads which are placed along the edges of the semiconductor memory device 1.

These so-called bridges are included in the category of multi-layered connections. Multi-layered connections usually cause a considerable magnitude of increase in resistance in the line in which they are found. This increase in resistance, in combination with capacitance which is inevitable for a semiconductor memory device, causes a considerable magnitude of increase in time constant, further resulting in a considerable magnitude of increase in delay of signal transmission. Due to the nature of memory devices, a slow signal transmission speed is undesired especially for lines connecting the control circuits, particularly the buffer circuits and the decoder circuit or for output signal lines connecting the memory cells and the output bonding pads.

SUMMARY OF THE INVENTION

The object of this invention is to provide a semiconductor memory device in which the signal transmission speed is improved for lines connecting control circuits, particularly buffer circuits and decoder circuit.

To accomplish the aforementioned object, a semiconductor memory device in accordance with this invention is provided with: (1) a plurality of memory cells and a decoder circuit arranged at the center thereof; (2) at least one ground line arranged to surround the plurality of memory cells and decoder circuit; (3) at least one control circuit, such as a buffer circuit and a logic circuit, if any, arranged beneath or in the area outside the loop formed by the ground line, with the terminals connected to the memory cells or the decoder circuit arranged inwardly or inside the loop of the ground line, and the terminals connected to the other control circuit, or circuits such as buffer circuits and logic circuits, if any, arranged outwardly or outside the loop of the ground line; (4) a plurality of signal lines connecting the control circuits with each other, i.e., connecting the buffer circuits with each other, the buffer circuits and logic circuits, if any, or logic circuits with each other, if any, arranged in the area surrounding or outside the ground line and the control circuits; (5) at least one electric power supply line arranged surrounding the signal lines or outside the loop of the signal lines; and (6) a plurality of bonding pads arranged outside the loop of electric power supply line.

When a control circuit is arranged beneath the ground line, these two elements can be connected through vertical lines, excluding bridges. The terminal arrangement described in Item (3) above is made possible by arranging the ground line on top of the active elements, such as transistors or diodes, which constitute each of the control circuits such as, i.e., buffer circuits and logic circuits, if any.

This layout of each ingredient constituting a semiconductor memory device effectively (1) excludes bridges from the lines connecting each of the control circuits, such as buffer circuits and logic circuits, if any, and each of the decoder circuit or memory cells, and (2) excludes bridges from the lines connecting the control circuits, such as buffer circuits and logic circuits, if any, with each other. Thus, the transmission speed of signals is considerably improved between each of the control circuits, such as buffer circuits and logic circuits, if any, and each of the decoder circuit and memory cells, and between the control circuits, such as buffer circuits and logic circuits, if any, with each other.

Another embodiment is available in which: (1) the ground line and some or all of the signal lines are partly or entirely arranged on top of some or all of the control circuits, such as buffer circuits and logic circuits, if any; and (2) the terminals of the control circuits connected with the memory cells or the decoder circuit are arranged inwardly and the terminals of the control circuits connected to the electric power supply line or to the bonding pads are arranged outwardly. This terminal arrangement is possible by arranging these lines on top of the active elements, such as transistors or diodes. This layout is effective for excluding bridges crossing the signal lines. To accomplish this terminal arrangement, vertical lines are employed to connect the control circuits, which are arranged beneath the ground line, the signal lines and the electric power supply lines.

A further embodiment is available in which a portion of the ground line is discontinued or separated to allow the electric power supply line and some of the signal lines to pass through this discontinued area to reach the decoder circuit. This layout is effective to exclude some more bridges.

An additional embodiment is available in which: (1) the ground line is shortened or separated to allow the electric power supply line to pass through the area from which the electric power supply line is partly separated, to reach the memory cells and decoder circuit; and (2) some of the control circuits, particularly the address buffer circuit and the write-in buffer circuit, are grounded through a branch of the ground line arranged on top of the decoder circuit. This layout is effective to entirely exclude bridges between the electric power supply line and the ground line.

All the above mentioned embodiments can be modified by exchanging the ground line and the electric power supply line.

BRIEF DESCRIPTION OF THE DRAWINGS

The present invention, together with its various features and advantages, can be readily understood from the following more detailed description presented in conjunction with the following drawings, in which.

DETAILED DESCRIPTION OF THE PREFERRED EMBODIMENTS

Figure 1:
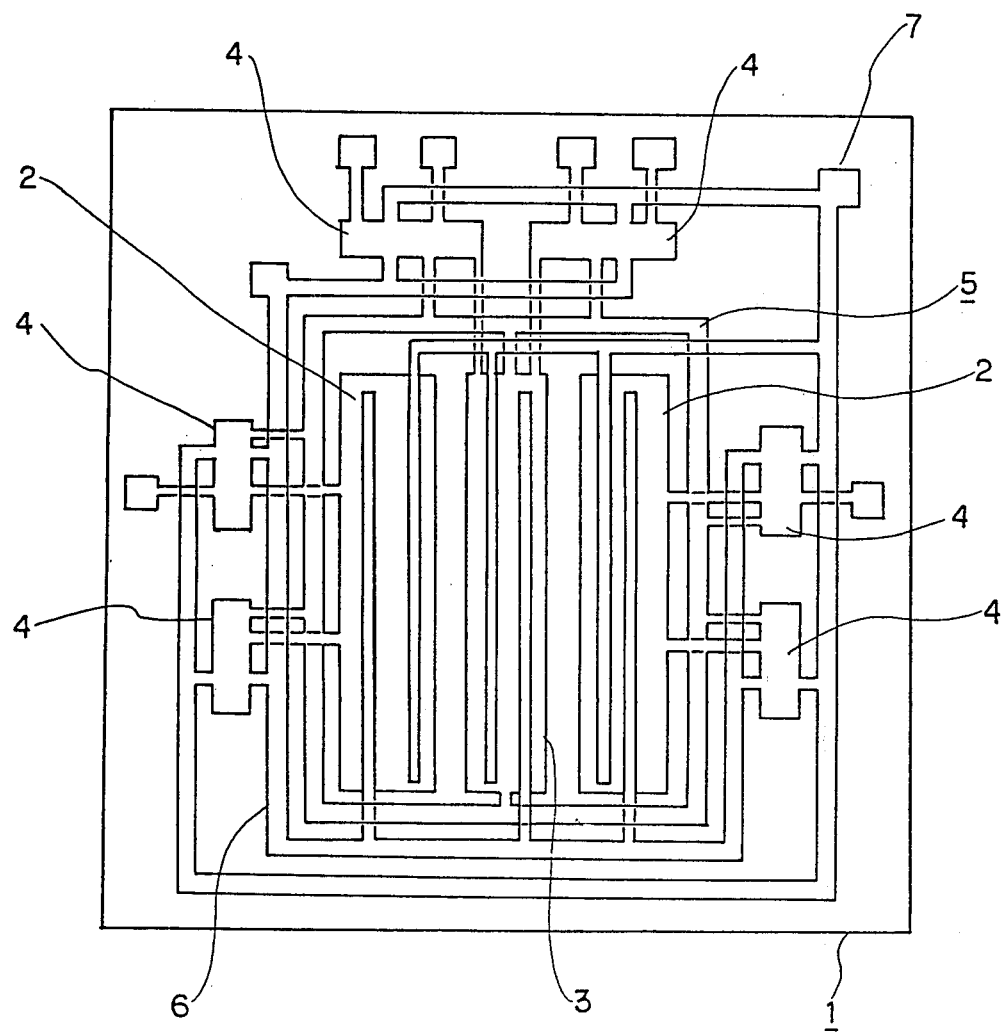
FIG. 1 is a schematic drawing illustrating an exemplary layout of a semiconductor memory device available in the prior art.
Figure 2:
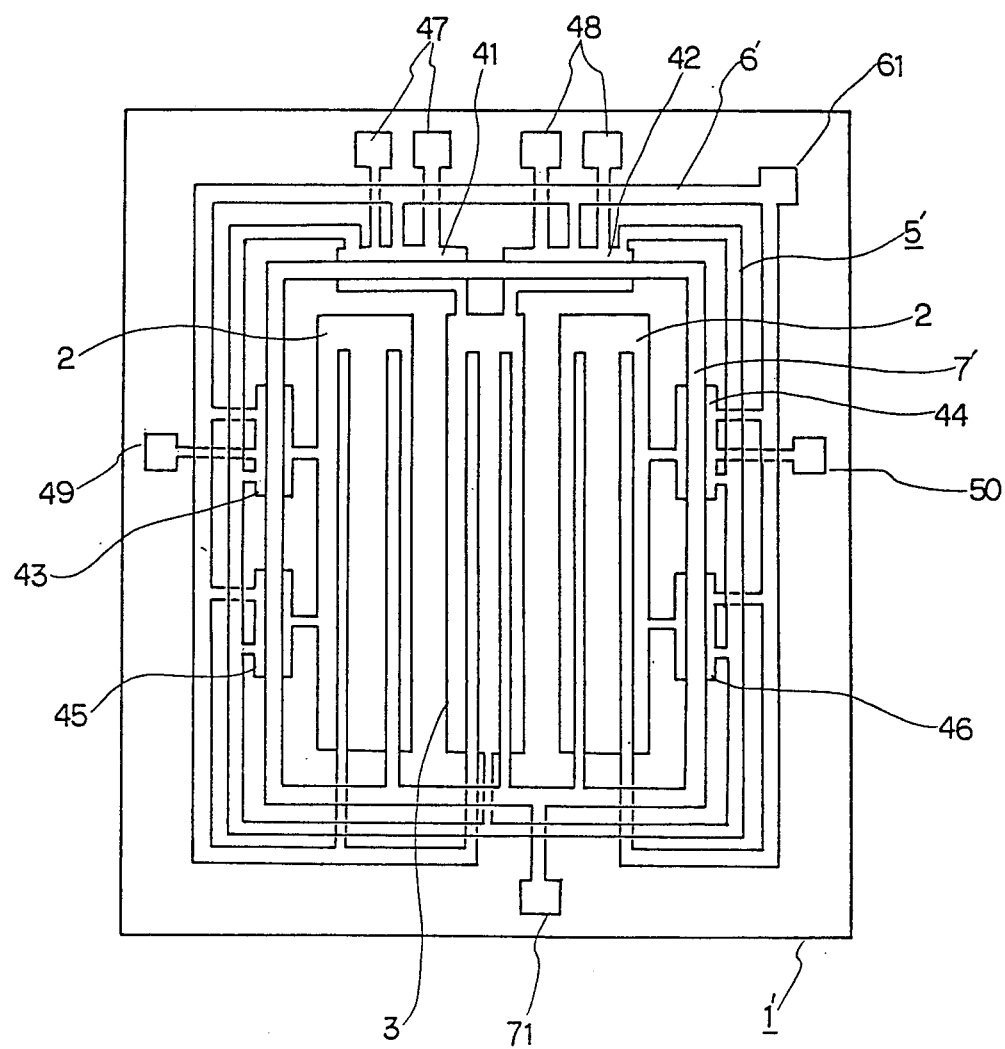
FIG. 2 is a schematic drawing illustrating the layout of a semiconductor memory device in accordance with an embodiment of the present invention.

Referring to FIG. 2, numeral 1' indicates a semiconductor memory device. Memory cells 2 and decoder circuit 3 are arranged at the center of the semiconductor memory device 1'. A ground line (GND) 7' (a first electric power supply line) is arranged to surround the above-mentioned elements 2 and 3. A bonding pad 71 is employed to ground the ground line (GND) 7'. Each of the buffer circuits and logic circuits, such as an address buffer circuit 41, a write-in buffer circuit 42, read-out buffer circuits 43 and 44, and logic circuits 45 and 46 are arranged beneath the ground line (GND) 7'. The ground line (GND) 7', each of the buffer circuits 41, 42, 43 and 44, and the logic circuits 45 and 46 are connected through vertical lines, thus making connecting bridges for these elements unnecessary. The terminals for connection of the buffer circuits 41, 42, 43 and 44, or the logic circuits 45 and 46 to the decoder circuit 3, or the memory cell areas 2, are arranged inwardly or toward the area surrounded by the loop of the ground line (GND) 7', thus making connecting bridges for these elements unnecessary. On the other hand, the terminals for connection of the buffer circuits 41, 42, 43 and 44, or the logic circuits 45 and 46, with each other are arranged outwardly or toward the area surrounded by the loop of the signal lines 5', thus making connecting bridges for these elements also unnecessary due to the arrangement of signal lines 5' connecting the buffer circuits 41, 42, 43 and 44 or logic circuits 45 and 46 with each other in the area surrounding these elements. The signal lines 5' respectively transmit the control signals for the buffer circuits.

The aforementioned terminal arrangement is readily possible by arranging the ground line (GND) 7' on top of active devices, such as transistors or diodes, constituting the buffer circuits 41, 42, 43 and 44 or logic circuits 45 and 46. An electric power supply line (Vcc) 6' (a second electric power supply line) is arranged to further surround the signal lines 5', i.e., in the utmost outer area of the semiconductor memory device 1'. A bonding pad 61 is also arranged in this area to supply the electric power to the electric power supply line (Vcc) 6'. The other bonding pads 47, 48, 49 and 50 are arranged along the edges of the semiconductor memory device 1'.

In this embodiment, bridges still remain: (1) for connection of the electric power supply line (Vcc) 6' and some of the buffer circuits, specifically read-out buffers 43 and 44 or logic circuits 45 and 46; (2) for connection of the electric power supply line (Vcc) 6' and the memory cell areas 2 and the decoder circuit 3; (3) for connection of the address buffer 41 and its bonding pad 47; (4) for connection of the write-in buffer 42 and its bonding pad 48; and (5) for connection of each of the read-out buffer circuits 43 and 44 with each of their respective bonding pads 49 and 50. These connection lines having the bridges inevitably involve a somewhat larger amount of resistance and capacitance, and result in somewhat less of a signal transmission speed or in more delay in the signal transmission. It is noted in this embodiment, however, bridges are entirely excluded from all of the lines for which a high signal transmission speed is required. More specifically, it is a significant advantage that all the lines connected to the terminals of the buffer circuits 41, 42, 43 and 44 and the logic circuits 45 and 46, which are arranged inwardly or inside the ground line (GND) 7', and all the signal lines 5' are entirely free from bridges. One of the factors determining the access time to a memory cell in the memory cell areas 2 is the signal transmission speed through the lines connecting the buffer circuits, the decoder circuit and the memory cell.

Thus, in accordance with this embodiment, there is provided a semiconductor memory device in which the signal transmission speed is improved for lines connecting buffer circuits and a decoder circuit.

Figure 3:
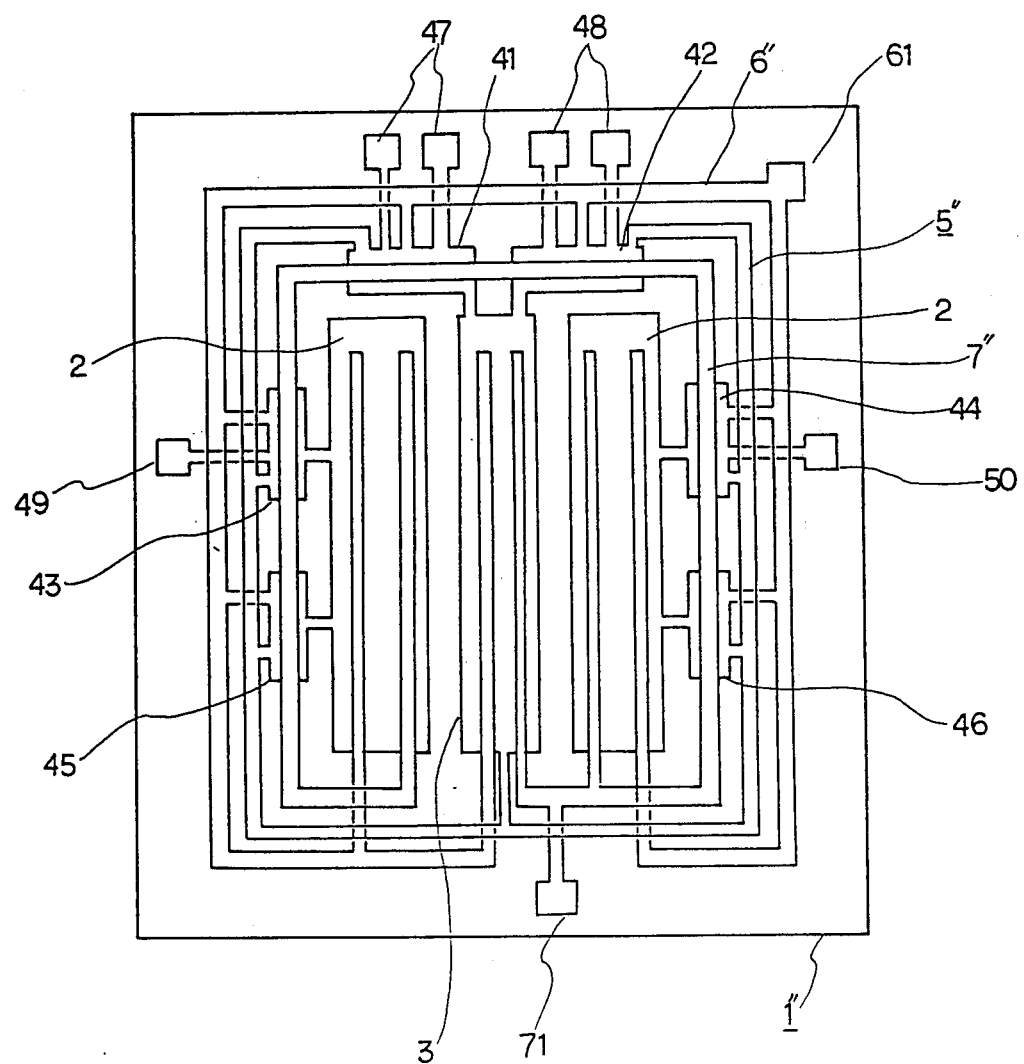
FIG. 3 is a schematic drawing for a semiconductor memory device in accordance with another embodiment of the present invention.

FIG. 3 illustrates the layout of a semiconductor memory device 1" in accordance with another embodiment of this invention. The layout of this embodiment is similar to that of the embodiment illustrated in FIG. 2, except that a portion of the ground line (GND) 7" is discontinued to allow the electric power supply line (Vcc) 6" and a portion of the signal lines 5" to pass through the discontinued area without employing a bridge. This means that two further bridges are eliminated by using this embodiment in comparison with the first embodiment.

Figure 4:
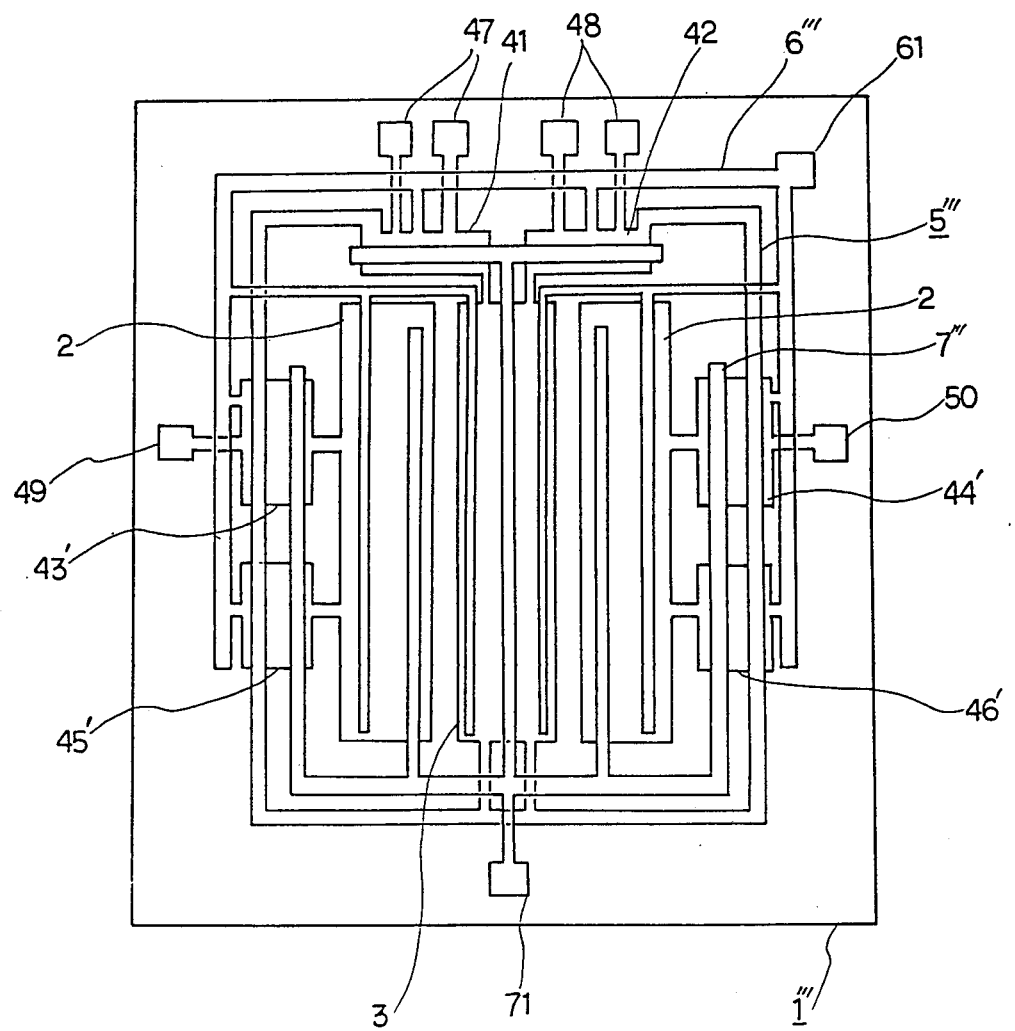
FIG. 4 is a schematic drawing for a semiconductor memory device in accordance with a further embodiment of the present invention.

FIG. 4 illustrates the layout of a semiconductor memory device 1''' in accordance with a third embodiment of this invention, wherein the ground line (GND) 7''' is shortened to allow an electric power supply line (Vcc) 6''' to pass through the area where the portion of the ground line (GND) 7''' is removed, to reach the memory cell areas 2, the decoder circuit 3, and some of the buffer circuits, specifically the address buffer 41 and the write-in buffer 42, which are grounded through a branch of a ground line (GND) 7''' arranged on top of the decoder circuit 3 and T-shaped at its end. Incidentally, the electric power supply line (Vcc) 6''' is also shortened. As a result, the ground line (GND) 7''' and the electric power supply line (Vcc) 6''' are allowed to reach each buffer circuit and each logic circuit without passing through a bridge, causing less of a magnitude of voltage drop for these lines. It is additionally noted in this embodiment that not only the ground line (GND) 7''', but also some of the signal lines 5''' are arranged on top of some of the buffer circuits 43' and 44' and/or the logic circuits 45' and 46', effectively excluding the need for bridges between the electric power supply line (Vcc) 6''' and the buffer circuits 43' and 44' the logic circuits 45' and 46', and the outgoing bonding pads 49 and 50. This exclusion of bridges is due to the terminal arrangement similar to that described for the first embodiment. Such a terminal arrangement is possible by arranging the ground line (GND) 7''' and the signal lines 5' on top of the active elements, such as transistors or diodes, constituting the buffer circuits 43' and 44' or the logic circuits 45' and 46'. Thus, all the lines connected to the terminals of the buffer circuits 41, 42, 43' and 44' and of the logic circuits 45' and 46' which are arranged inwardly or inside the ground line (GND) 7''' and most of the signal lines 5''' are free from bridges. However, no significant improvement is obtained for bonding pads 47, 48, 49, 50, 61 and 71. Overall, though, by using this embodiment, the access time to a memory cell is improved by a few nanoseconds.

Thus, in accordance with this invention, there is provided various types of semiconductor memory devices in which the signal transmission speed is improved for lines connecting buffer circuits and decoder circuit.

It will be appreciated that similar results can be realized by exchanging the location of a ground line and an electric power supply line.

Although this invention has been described with reference to specific embodiments, this description is not meant to be construed in a limited sense. Various modifications of the disclosed embodiments, as well as other embodiments of this invention, will become apparent to persons skilled in the art upon reference to the description of the invention. It is therefore contemplated that the appended claims and equivalents thereof will cover any such modifications or embodiments as fall within the true scope of this invention.

What is claimed is:

1. A semiconductor integrated circuit including a plurality of internal circuits arranged at the center thereof, a plurality of control circuits arranged in the area surrounding said internal circuits, a plurality of wirings connecting said control circuits and said internal circuits, a plurality of signal lines connecting said control circuits with each other, and at least one electric power supply line supplying a predetermined amount of voltage to said internal circuits and said control circuits, wherein the improvement comprises: said plurality of signal lines and said at least one electric power supply line being arranged in the area outside said plurality of wirings connecting said control circuits and said internal circuits.

2. A semiconductor memory device comprising:
a plurality of memory cells and a decoder circuit arranged at the center thereof,
at least one ground line arranged in the area surrounding said plurality of memory cells and the decoder circuit,
at least one control circuit arranged in the area outside the loop of said at least one ground line,
a plurality of signal lines for connecting said at least one control circuit, said plurality of signal lines being arranged in the area surrounding said at least one control circuit and said at least one ground line, and
at least one electric power supply line arranged in the area outside the loop of said plurality of signal lines.

3. A semiconductor memory device comprising:
a plurality of memory cells and a decoder circuit arranged at the center thereof,
at least one ground line arranged in the area surrounding said plurality of memory cells and the decoder circuit,
at least one control circuit arranged beneath said at least one ground line,
a plurality of signal lines connecting said at least one control circuit, said plurality of signal lines being arranged in the area surrounding said at least one control circuit and said at least one ground line, and
at least one electric power supply line arranged in the area outside the loop of said plurality of signal lines.

4. A semiconductor memory device comprising:
a plurality of memory cells and a decoder circuit arranged at the center thereof,
at least one ground line arranged in the area surrounding said plurality of memory cells and the decoder circuit,
at least one control circuit arranged beneath said at least one ground line,
a plurality of signal lines connecting said at least one control circuit, said plurality of signal lines being arranged above said at least one control circuit, and
at least one electric power supply line arranged in the area surrounding said at least one control circuit and said plurality of signal lines.

5. A semiconductor memory device comprising:
a plurality of memory cells and a decoder circuit arranged at the center thereof,
at least one electric power supply line arranged in the area surrounding said plurality of memory cells and the decoder circuit, at least one control circuit arranged in the area outside the loop of said at least one electric power supply line, a plurality of signal lines connecting said at least one control circuit, said plurality of signal lines being arranged in the area surrounding said at least one control circuit and said at least one electric power supply line, and at least one ground line arranged in the area outside the loop of said plurality of said signal lines.

6. A semiconductor memory device comprising:
a plurality of memory cells and a decoder circuit arranged at the center thereof,
at least one electric power supply line arranged in the area surrounding said plurality of memory cells and the decoder circuit,
at least one control circuit arranged beneath said at least one electric power supply line,
a plurality of signal lines connecting said at least one control circuit, said plurality of signal lines being arranged in the area surrounding said at least one control circuit and said at least one electric power supply line, and
at least one ground line arranged in the area outside the loop of said plurality of signal lines.

7. A semiconductor memory device comprising: a plurality of memory cells and a decoder circuit arranged at the center thereof,
at least one electric power supply line arranged in the area surrounding said plurality of memory cells and the decoder circuit, at least one control circuit arranged beneath said at least one electric power supply line,
a plurality of signal lines connecting said at least one control circuit, said plurality of signal lines being arranged above said at least one control circuit, and
at least one ground line arranged in the area surrounding said at least one control circuit and said plurality of signal lines.

8. A semiconductor memory device defined in claim 2, 3 or 4, wherein a portion of said ground line is separated for forming a separated area and a portion of said electric power supply line and a portion of said signal lines pass through the separated area of said ground line to reach said decoder circuit.

9. A semiconductor memory device defined in claim 2, 3 or 4, wherein a portion of said ground line is separated for forming a separated area to allow a portion of said at least one electric power supply line to pass through the separated area of said ground line to reach said memory cells and said decoder circuit, and a portion of said ground line being arranged on top of said decoder circuit for grounding a portion of said control circuits.

10. A semiconductor memory device defined in claim 5, 6 or 7, wherein a portion of said electric power supply line is separated for forming a separated area and a portion of said ground line and a portion of said signal lines pass through the separated area of said electric power supply line to reach said decoder circuit.

11. A semiconductor memory device defined in claim 5, 6 or 7, wherein a portion of said electric power supply line is separated for forming a separated area to allow a portion of said at least one ground line to pass through the separated area of said electric power supply line to reach said memory cells and said decoder circuit, and a portion of said electric power supply line being arranged on top of said decoder circuit for supplying electric power to a portion of said control circuits.

* * * * *

UNITED STATES PATENT AND TRADEMARK OFFICE
CERTIFICATE OF CORRECTION

PATENT NO. : 4,439,841

DATED : 3/27/84

INVENTOR(S) : HIDEO ITOH ET AL.

It is certified that error appears in the above-identified patent and that said Letters Patent is hereby corrected as shown below:

Col. 2
Line 54, delete "such as".

Col. 5
Line 30, "44'" should be --44',--.

Col. 6
Line 62, begin "at least" as a new paragraph;
Line 64, begin "a plurality" as a new paragraph.

Col. 7
Line 18, begin "a plurality" as a new paragraph;
Line 23, begin "at least" as a new paragraph.

Signed and Sealed this

Twentieth Day of November 1984

[SEAL]

Attest:

GERALD J. MOSSINGHOFF

Attesting Officer

Commissioner of Patents and Trademarks